(12) United States Patent
Bugge et al.

(10) Patent No.: US 8,502,172 B1
(45) Date of Patent: Aug. 6, 2013

(54) THREE DIMENSIONAL FIDUCIAL

(75) Inventors: Cliff Bugge, Portland, OR (US); Greg Clark, Hillsboro, OR (US); Todd Hanson, Beaverton, OR (US); Scott Edward Fuller, Portland, OR (US); Jason Donald, Portland, OR (US)

(73) Assignee: FEI Company, Hillsboro, OR (US)

( * ) Notice: Subject to any disclaimer, the term of this patent is extended or adjusted under 35 U.S.C. 154(b) by 0 days.

(21) Appl. No.: 13/533,870

(22) Filed: Jun. 26, 2012

(51) Int. Cl.
*H01J 37/30* (2006.01)

(52) U.S. Cl.
CPC ..................... *H01J 37/30* (2013.01)
USPC .................. 250/492.1; 250/492.2

(58) Field of Classification Search
USPC .......................... 250/492.1, 492.2
See application file for complete search history.

(56) References Cited

U.S. PATENT DOCUMENTS

| 5,435,850 A | 7/1995 | Rasmussen |
| 5,851,413 A | 12/1998 | Casella et al. |
| 7,348,556 B2 * | 3/2008 | Chitturi et al. ............... 250/309 |
| 7,939,906 B2 * | 5/2011 | Luo et al. ...................... 257/486 |
| 2012/0217152 A1 * | 8/2012 | Miller ...................... 204/192.34 |

* cited by examiner

*Primary Examiner* — Kiet T Nguyen
(74) *Attorney, Agent, or Firm* — Scheinberg & Associates, PC; Michael O. Scheinberg; John B. Kelly

(57) ABSTRACT

A method and system for forming and using a fiducial on a sample to locate an area of interest on the sample, the method comprising forming a fiducial by depositing a block of material on a sample proximal to an area of interest on the sample, the block of material extending from the surface of the sample to a detectable extent above the surface of the sample; and milling, using a charged particle beam, a predetermined pattern into at least two exposed faces of the block of material; subsequent to forming the fiducial, detecting the location of the area of interest by detecting the location of the fiducial; and subsequent to detecting the location of the area of interest, imaging or milling the area of interest with a charged particle beam.

27 Claims, 13 Drawing Sheets

US 8,502,172 B1

THREE DIMENSIONAL FIDUCIAL

TECHNICAL FIELD OF THE INVENTION

The present invention relates to charged particle beam imaging and milling.

BACKGROUND OF THE INVENTION

Charged particle beams, laser beams, and neutral particle beams are used in a variety of microfabrication applications, such as fabrication of semiconductor circuitry and microelectromechanical assemblies. The term "microfabrication" is used to include creating and altering structures having dimensions of tens of microns or less, including nanofabrication processes. "Processing" a sample refers to the microfabrication of structures on that sample. As smaller and smaller structures are fabricated, it is necessary to direct the beam more precisely.

One method of accurately positioning a beam is to place or mill a fiducial, that is, a reference mark, on the sample near an area of interest, and position the beam relative to the fiducial. The term fiducial is used broadly to include any type of reference mark. A beam is initially directed to image a fiducial and an initial offset to the desired location is determined. Subsequently, the beam is periodically directed to image the fiducial and the positioning of the beam to the desired location is corrected by determining an offset between the observed coordinates of the fiducial and the original coordinates of the fiducial. The offsets are then added to the beam positioning instructions so that the beam ends up at the desired location.

FIG. 1A shows a top view of a sample 100 including an area of interest 102 and a fiducial 104. Area of interest 102 is a portion of sample 100 where an imaging or milling operation is to be performed. For example, sample 100 may comprise a semiconductor wafer and area of interest 102 may comprise a particular integrated circuit feature that is to be imaged by a scanning electron microscope or focused ion beam to verify whether the feature has been manufactured to within specification. Typically, a charged particle beam is used to mill fiducial 104 in the surface of the sample near area of interest 102 so that the area of interest can be located quickly and easily among a surface having many different features. When subsequently imaged at an angle that is normal to the surface of sample 100 ("top down view"), fiducial 104 can be more readily or quickly identified by the operator of the instrument (or by automation software controlling the instrument) than the area of interest 102 itself can be identified.

However, fiducial 104 becomes less identifiable as fiducial 104 is imaged at angles that are not normal to the top surface of sample 100. For angles that are nearly parallel to the top surface of the sample 100, fiducial 104 may not be identifiable at all. The top surface of sample 100 is the surface that is opposite of the surface that is in contact with the sample stage holding sample 100. FIG. 1B shows a side view of sample 100 in which fiducial 104 cannot be seen. Positioning the beam for imaging or milling at this angle would require a second fiducial.

SUMMARY OF THE INVENTION

Embodiments of the present invention are directed to a method for forming and using a fiducial on a sample to locate an area of interest on the sample. Embodiments of the method include forming a fiducial by depositing a block of material on a sample proximal to an area of interest on the sample, the block of material extending from the surface of the sample to a detectable extent above the surface of the sample; and milling, using a charged particle beam, a predetermined pattern into at least two exposed faces of the block of material; subsequent to forming the fiducial, detecting the location of the area of interest by detecting the location of the fiducial; and subsequent to detecting the location of the area of interest, imaging or milling the area of interest with a charged particle beam.

Embodiments of the present invention are also directed to a system comprising at least one charged particle beam, a sample stage, a sample disposed upon the sample stage, and a fiducial disposed upon the sample. The fiducial comprises a block of material deposited proximal to an area of interest on the sample, the block of material extending from the surface of the sample to a detectable extent above the surface of the sample, and a predetermined pattern milled into at least two exposed faces of the block of material Embodiments of the present invention are also directed to a method of forming a fiducial on a sample to locate an area of interest on the sample. Embodiments of the method include rotating the sample substantially ninety (90) degrees from an imaging position, subsequent to rotating the sample substantially ninety (90) degrees from the imaging position depositing a block of material on or near the area of interest using a charged particle beam that is directed toward the surface of the sample at an angle that is not perpendicular to the surface of the sample, and subsequent to depositing the block of material and prior to detecting the location of the area of interest rotating the sample substantially ninety (90) degrees to return the sample back to its initial position.

The foregoing has outlined rather broadly the features and technical advantages of the present invention in order that the detailed description of the invention that follows may be better understood. Additional features and advantages of the invention will be described hereinafter. It should be appreciated by those skilled in the art that the conception and specific embodiments disclosed may be readily utilized as a basis for modifying or designing other structures for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

For a more thorough understanding of the present invention, and advantages thereof, reference is now made to the following descriptions taken in conjunction with the accompanying drawings, in which.

DETAILED DESCRIPTION OF PREFERRED EMBODIMENTS

Embodiments of the present invention are directed to a fiducial that provides accurate beam placement for the automation of imaging and milling operations that involve more than one beam or stage position. The fiducial extends to a detectable extent into three dimensions above a surface of a sample. The three dimensional ("3D") fiducial is a single reference point that can be recognized simultaneously from different angles. Such a 3D fiducial can be used, for example, with a dual-beam system that includes an electron beam and an ion beam, such as the DualBeam™ family of instruments commercially available from FEI Company of Hillsboro, Oreg., the assignee of the present application. The 3D fiducial can be used for both electron beam image recognition and ion beam image recognition, simplifying the procedure because fewer moving parts are required. The 3D fiducial is not limited to dual-beam systems, however, and can be used with both single beam systems as well as multiple beam systems. The 3D fiducial can be applied to any automation requiring image recognition, including automated Slice and View™ instruments and instruments using AutoTEM™ and iFAST™ software, all of which are commercially available from FEI Company.

The 3D fiducial is built by depositing a block of material on a sample near an area of interest and then milling unique patterns into the top and sides. These patterns will have distinct brightness and contrast values relative to the background block material allowing for image recognition. At the eucentric location or height, the fiducial can be recognized from one or more beams as well as from various stage tilt and rotation positions. Eucentric height is the height of the specimen at which its image does not moved laterally as a function of specimen tilt. The 3D fiducial allows for FIB cut placement using image recognition on an almost vertical plane. Relative to the incident beam, image and cut placement have traditionally been done with a top down fiducial. The prior art top down approach is not possible with milling at glancing angles (i.e., angles that are nearly parallel to the surface of the sample that is being milled or imaged) due to the almost vertical view the FIB has while cutting down the plane. For example, a fiducial mark can be cut into the top and side of a raised Platinum pad allowing ion beam image recognition from this glancing angle. Using a 45° pre-tilt stub allows beam image recognition from additional angles.

The 3D fiducial can be used with any automated application that requires a fiducial. When the automation requires one or more beams and one or more stage positions, the 3D fiducial provides a single reference point solution. The 3D fiducial is particularly useful in charged particle beam applications, such as scanned electron microscopy (SEM), transmission electron microscopy (TEM), scanning transmission electron microscopy (STEM), and imaging and milling with focused ion beam (FIB) systems.

Figure 1A:
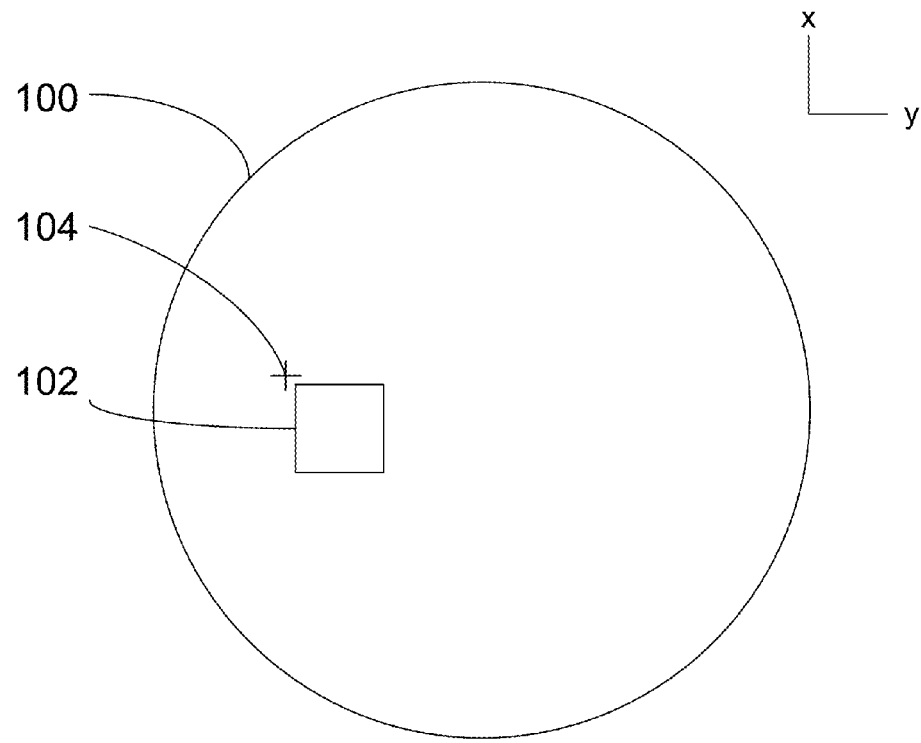
FIG. 1A shows a top view of sample 100, including area of interest 102 and fiducial 104.
Figure 1B:
FIG. 1B shows a side view of sample 100.
Figure 2A:
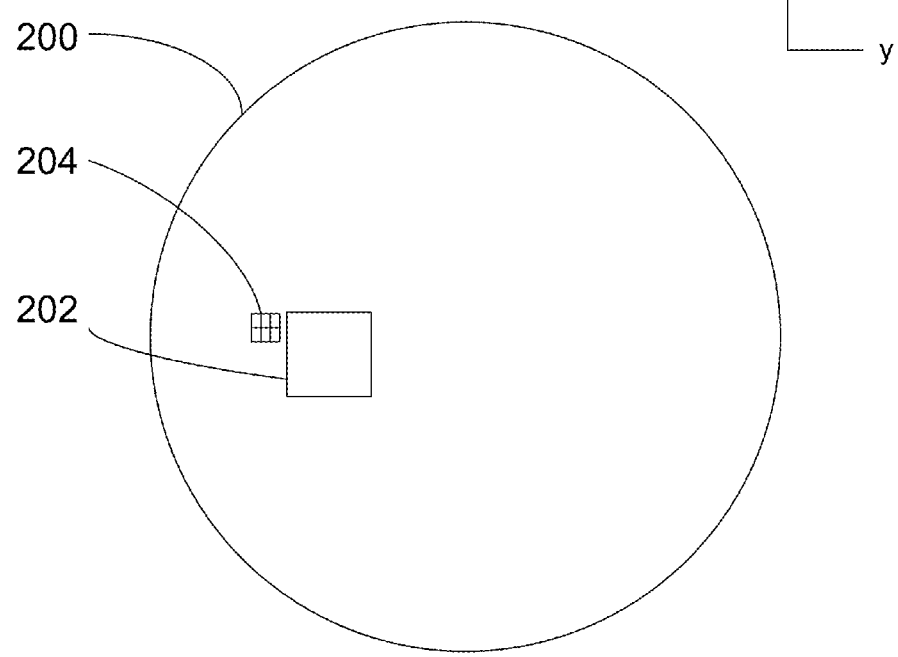
FIG. 2A shows a top view of sample 200, including area of interest 202 and three-dimensional fiducial 204.
Figure 2B:
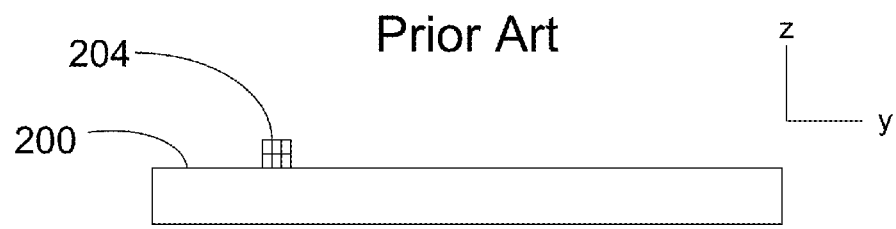
FIG. 2B shows a side view of sample 200, including three-dimensional fiducial 204.

Turning now to the drawings, FIG. 2A shows a top view of sample 200, including area of interest 202 and 3D fiducial 204. FIG. 2B shows a side view of sample 200, including 3D fiducial 204. Area of interest 202 is a portion of sample 200 where an imaging or milling operation is to be performed. Sample 200 may include, but is not limited to, a semiconductor wafer including integrated circuit features, a fixed biological sample, or bulk material for transmission electron microscopy (TEM) sample preparation. For example, sample 100 may comprise a semiconductor wafer and area of interest 102 may comprise a particular integrated circuit feature that is to be imaged by a scanning electron microscope or focused ion beam to verify whether the feature has been manufactured to within specification. In applications such as these, the largest dimension of area of interest 202 may be less than one micrometer (1 µm). In one embodiment of the present invention, the largest dimension of 3D fiducial 204 is no greater than 100 µm. In another embodiment of the present invention, the largest dimension of 3D fiducial 204 is no greater than 10 µm. In yet another embodiment of the present invention, the largest dimension of 3D fiducial 204 is no greater than 1 µm.

3D fiducial 204 extends to a detectable extent into three dimensions above a sample surface that is to be imaged or milled. The term "above" as used herein means extending in a direction away from the interior of the sample material and toward empty space. The term "detectable" means capable of being resolved using a charged particle beam system. Because 3D fiducial 204 extends to a detectable extent into three dimensions above the sample surface, 3D fiducial 204 is viewable by a charged particle beam directed toward sample 200 at a much wider set of angles than a fiducial that is substantially coplanar with the top surface of sample 200 or milled down into the surface of sample 200. The charged particle beam includes, but is not limited to, an electron beam, an ion beam, and a laser beam. 3D fiducial 204 is viewable from any angle that is normal to the top surface of sample 200 (90 degrees), coplanar with the top surface of sample 200 (0 degrees), or any angle between 0 degrees and 90 degrees relative to the top surface of sample 200. Charged particle beams directed at glancing angles close to the top surface of sample 200, for example angles less than 10 degrees, can more readily form an identifiable image of 3D fiducial 204 because 3D fiducial 204 extends to a detectable extent above the plane of the top surface of sample 200.

Preferably, 3D fiducial 204 is milled with a unique, predetermined pattern, such as predetermined pattern 206, on a least two exposed faces of 3D fiducial 204. Predetermined pattern 206 is milled to have distinct brightness and contrast values relative to the background block material to facilitate image recognition and location of 3D fiducial 204. In preferred embodiments of the present invention, image recognition software automatically locates the position of 3D fiducial 204 by analyzing an image formed by directing a charged particle beam at the surface of sample 200. Having a predetermined pattern on at least two faces of 3D fiducial 204 enables 3D fiducial 204 to be simultaneously imaged by two or more charged particle beams and at various stage tilt and rotation positions.

Figure 3:
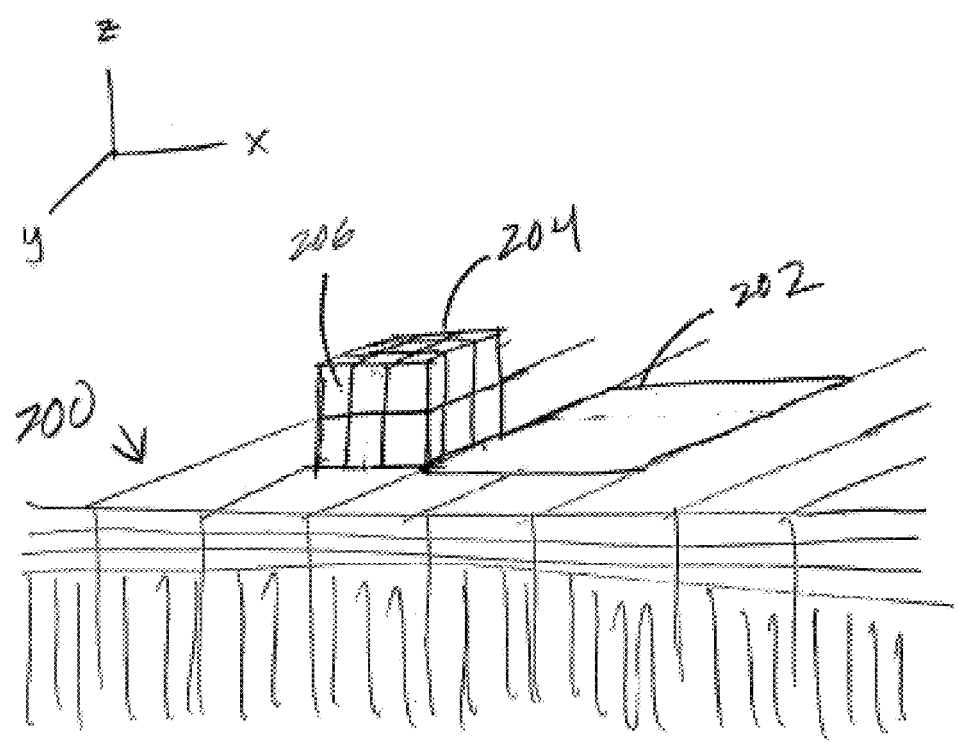
FIG. 3 shows an isometric view of a 3D fiducial in accordance with one or more embodiments of the present invention.

FIG. 3 shows a three dimensional view of 3D fiducial 204 in accordance with one or more embodiments of the present invention. 3D fiducial 204 is located substantially proximal to area of interest 202 on sample 200. 3D fiducial 204 extends to a detectable extent into three dimensions (x, y, z). 3D fiducial 204 is capable of being imaged or milled by a charged particle beam in at least two of the three dimensions. For example, if a charged particle beam is directed parallel to the surface of sample 200 and in the y-direction, then 3D fiducial 204 is visible in at least the xz-plane. Prior art fiducials, which are marks milled in the surface of sample 100, would be barely viewable, if at all, at angles that are nearly parallel to the surface of sample 200 because the fiducial do not extend to a detectable extent above the surface of the sample, making it difficult or impossible to detect the location of the prior art fiducial, especially for automated image recognition software.

Figure 4:
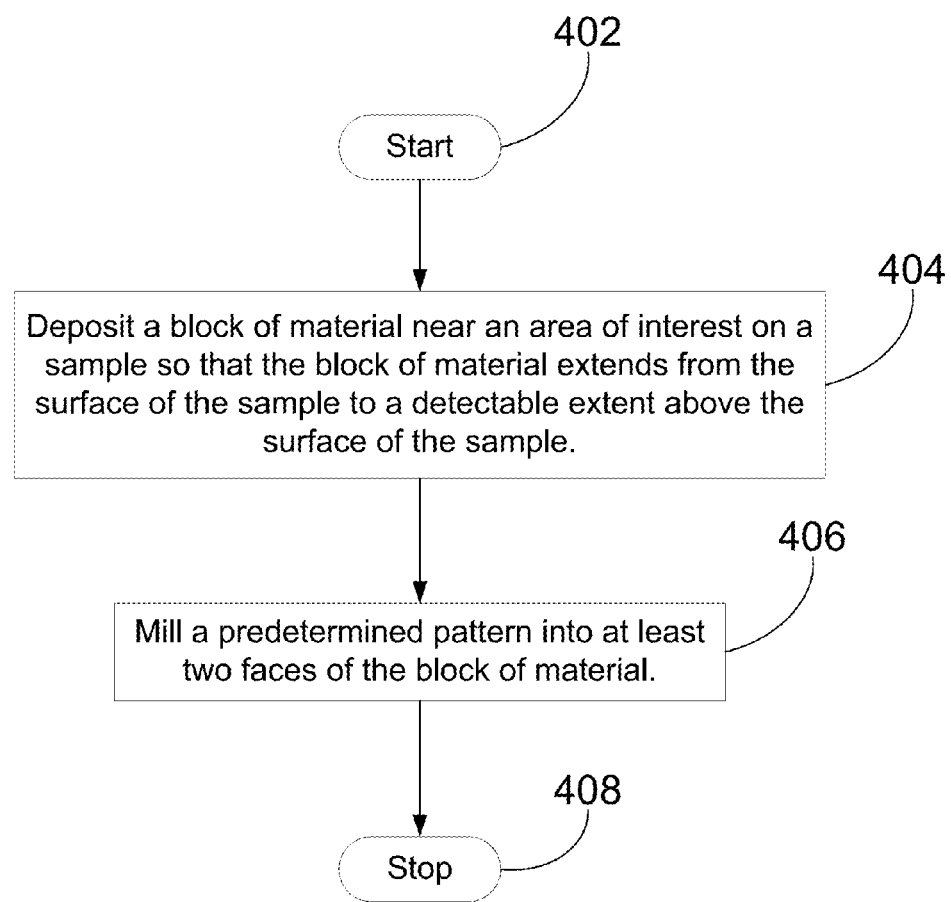
FIG. 4 shows a flowchart illustrating a method of forming a three-dimensional fiducial.

FIG. 4 shows flowchart illustrating a method of forming a three-dimensional fiducial. 3D fiducial 204 is formed by depositing a block of material on sample 200 proximal to area of interest 202 (step 404). The block of material is deposited such that it extends from the surface of the sample to a detectable extent above the surface of the sample. The block of material is deposited such that it is capable of being imaged or milled by a charged particle beam in at least two dimensions when the charged particle beam is directed at an angle within a set of angles that range between an angle that is coplanar with the sample surface that is being imaged or milled and an angle that is normal to the sample surface that is being imaged or milled. Any method for forming a deposit on a sample may be used. For example, the decomposition of a precursor gas in the presence of a charged particle beam can be used to deposit the block of material on sample 200. A charged particle beam is used to mill a predetermined pattern into at least two exposed faces of the block of material (step 406). The formed fiducial comprises the block of material milled with the predetermined pattern.

Figure 5:
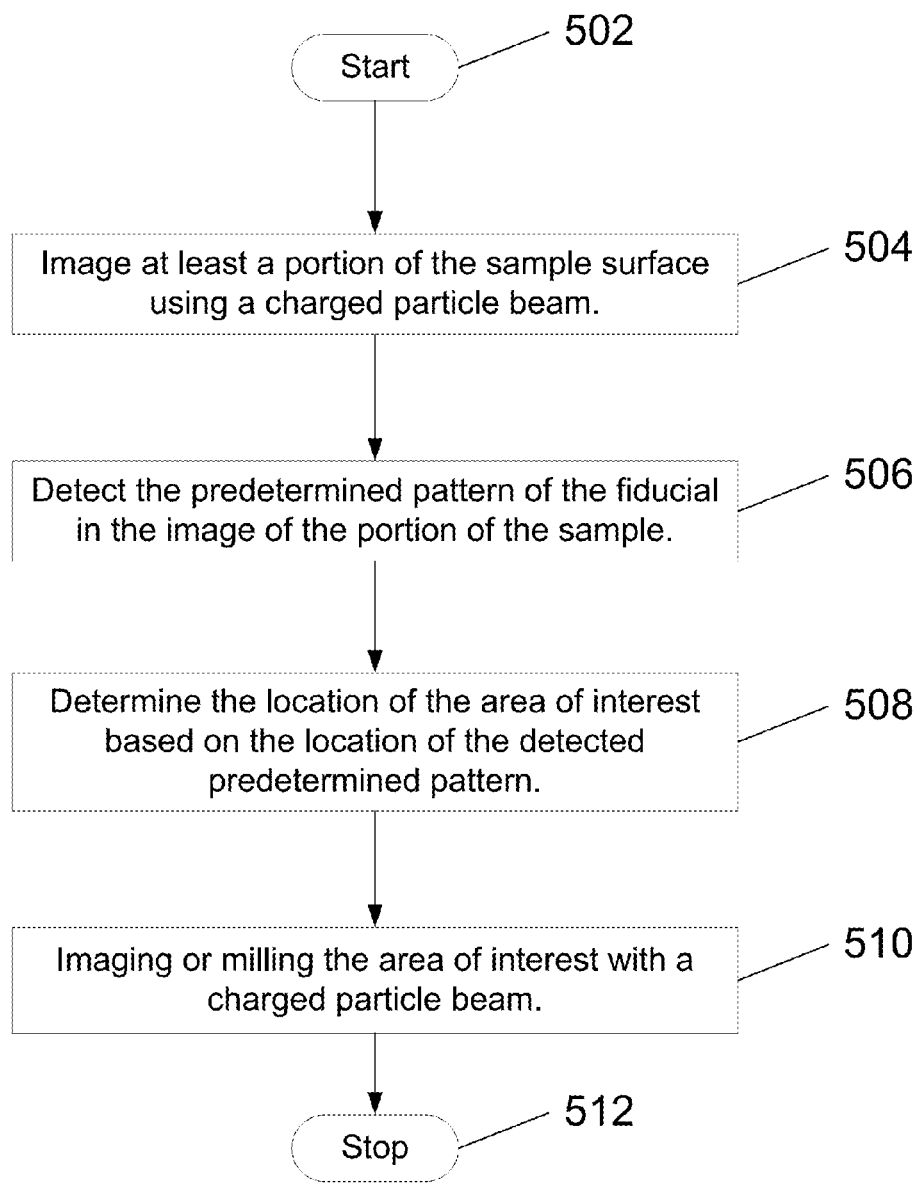
FIG. 5 shows a flowchart illustrating a method of using a three-dimensional fiducial to locate an area of interest on a sample.

FIG. 5 shows flowchart illustrating a method of using a three-dimensional fiducial to locate an area of interest on a sample. After forming 3D fiducial 204 using the method shown in FIG. 4, the location of area of interest 202 is detected by detecting the location of 3D fiducial 204. In one or more embodiments of the present invention, the location of the fiducial is detected by scanning a charged particle beam across at least a portion of the surface of sample 200 and forming an image of the surface of sample 200 (step 504). In at least one embodiment of the present invention, 3D fiducial 204 is positioned at a location where 3D fiducial 204 can be simultaneously imaged by at least two charged particle beams. 3D fiducial 204 is identified in an image of the sample surface by detecting the predetermined pattern 206 of 3D fiducial 204 in the image (step 506). In at least one embodiment, an operator of the charged particle beam instrument manually monitors the image of the surface of sample 200 until the operator detects an image of 3D fiducial 204, including the predetermined pattern milled on one or more of the exposed faces of 3D fiducial 204, in the image of the surface of sample 200. In a preferred embodiment of the present invention, a computer automatically analyzes the image of the surface of sample 200 and automatically detects predetermined pattern 206 of fiducial 204, for example, by detecting distinct brightness and/or contrast values associated with pre-determine pattern 206. The location of area of interest 202 is determined based on the location of detected predetermine pattern 206 and 3D fiducial 204 (step 508). After determining the location of area of interest 202 in step 508, area of interest 202 is imaged or milled with a charged particle beam (step 510).

Figure 6:
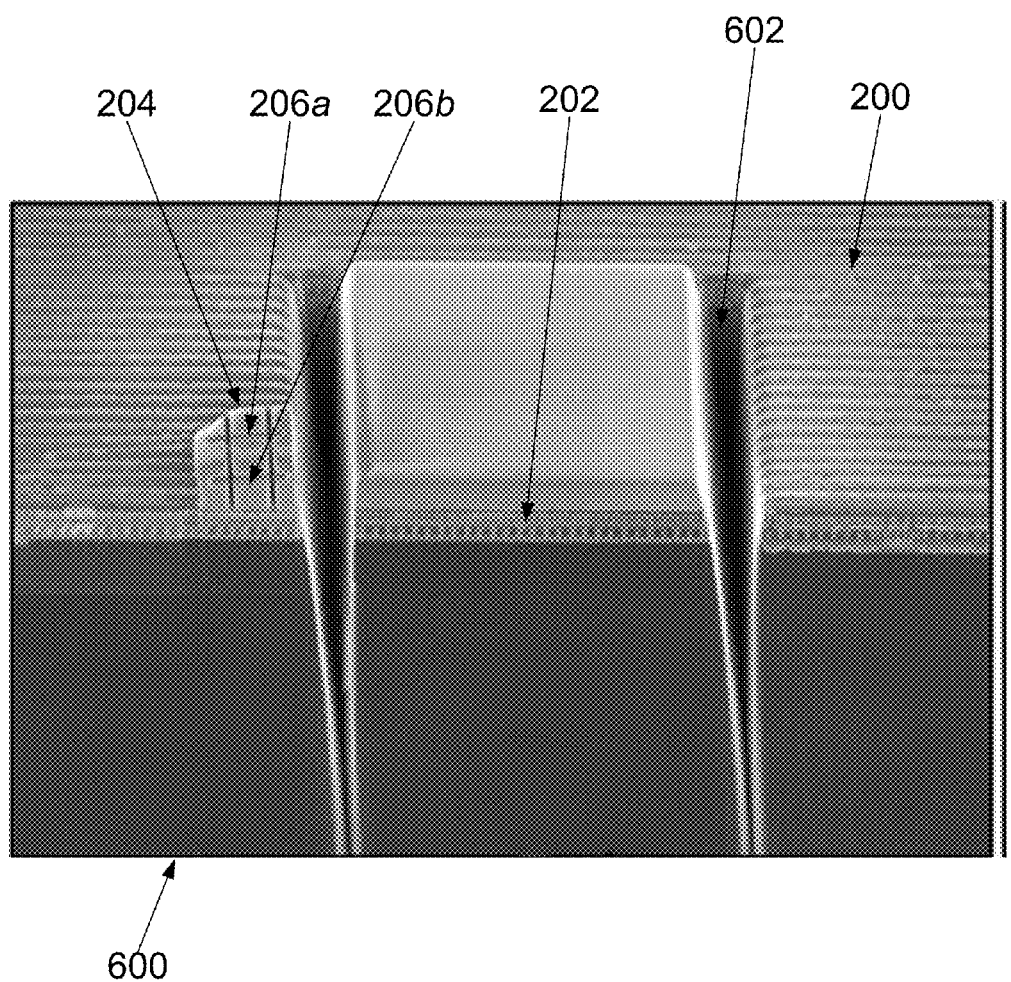
FIG. 6 shows a micrograph of an exemplary 3D fiducial in accordance with one or more embodiments of the present invention.

FIG. 6 shows a micrograph of an exemplary 3D fiducial formed in accordance with one or more embodiments of the present invention. Micrograph 600 was generated by directing an electron beam toward the surface of sample 200 at an angle of approximately fifty-two (52) degrees with respect to a normal to the top surface of sample 200. 3D fiducial 204 is deposited proximal to area of interest 202. Predetermined pattern 206a is milled into the top surface of 3D fiducial 204. The "top surface" is the surface of 3D fiducial 204 that is substantially parallel to the surface on which 3D fiducial 204 is despoisted but is not in contact with the sample 200. Predetermined pattern 206b is milled into a side surface of 3D fiducial 204. A "side surface" is a surface of 3D fiducial 204 that is substantially perpendicular to the surface on which 3D fiducial 204 is despoisted. As such, 3D fiducial 204 has a predetermined pattern 206a-b milled into at least two of its exposed surfaces, in accordance with step 406 of FIG. 4. The distinct brightness and contrast values of predetermined patterns 206a-b relative to the background block material of 3D fiducial 204 make 3D fiducial 204 more readily identifiable than area of interest 202. After locating area of interest 202 using 3D fiducial 204, trench 602 was milled around area of interest 202.

Figure 7:
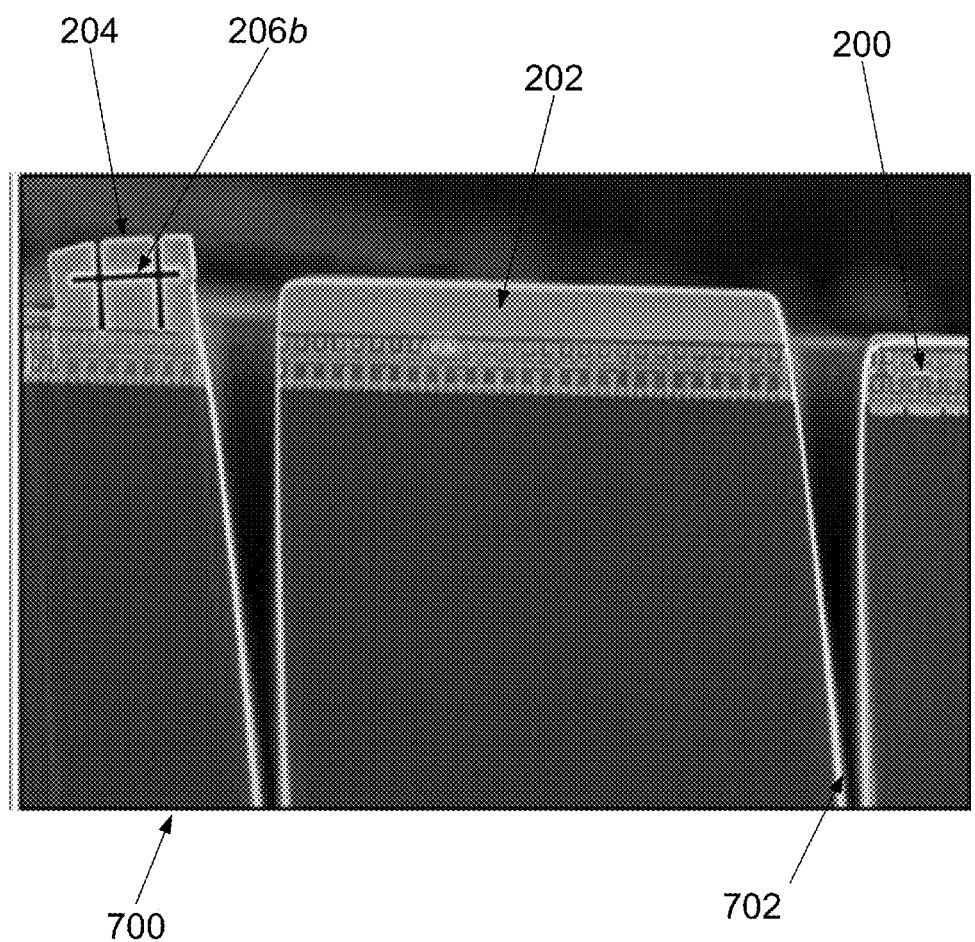
FIG. 7 shows a micrograph of an exemplary 3D fiducial in accordance with one or more embodiments of the present invention.

FIG. 7 shows another micrograph of an exemplary 3D fiducial in accordance with one or more embodiments of the present invention. Micrograph 700 was generated by directing an electron beam toward the surface of sample 200 at an angle of approximately ninety (90) degrees with respect to a normal to the top surface of sample 200. 3D fiducial 204 is deposited proximal to area of interest 202. A predetermined pattern (not shown) is milled into the top surface of 3D fiducial 204. Predetermined pattern 206b is milled into a side surface of 3D fiducial 204. 3D fiducial 204 has a predetermined pattern milled into at least two of its exposed surfaces, in accordance with step 406 of FIG. 4, even though only predetermined pattern 206b on the side surface of 3D fiducial is imaged by the charged particle beam. This is because the charged particle beam is directed at a glancing angle, in this case parallel to the top surface of sample 200, and the top surface of 3D fiducial 204 is not visible. A prior art fiducial, milled into the top surface of sample 200, would not be visible to a charged particle beam directed toward the surface of sample 200 at glancing angle for the same reason the predetermined pattern on the top surface of 3D fiducial is not visible. That is, surface features visible in a top-down or plan view are not readily visible, if at all, in a side or elevation view. However, because 3D fiducial extends to a detectable extent into three dimensions above a sample surface that is to be imaged or milled, the side of 3D fiducial, including predetermined pattern 206b, is visible to a charged particle beam directed toward the surface of sample 200 at glancing angle. That is, 3D fiducial 204 is visible in both the top-down/plan view and the side/elevation view, as well as any angle in between.

In some instances it is desirable to deposit the block of material using a charged particle beam that is directed toward the surface of sample 200 at an angle that is not orthogonal to the sample surface. For example, it is not possible to tilt the stage on some dual beam platforms to produce an orthogonal deposition edge with a scanning electron microscope (SEM). Additionally, when using small dual beam systems having stage tilt capability, an operator might prefer to avoid stage tilt when doing SEM deposition. However, creating an "x-direction" 3D fiducial (near zero damage) with a non-orthogonal SEM beam produces a non-orthogonal deposition profile, relative to the wafer surface, along the "x-direction". When the subsequent deposition is imaged with the FIB beam, normal to the wafer surface, the "z-direction" or "top down view" deposition profile is orthogonal in the "y-direction", but not in the "x-direction". It is critical in automated "zero-damage" applications to image an area of interest and simultaneously create a fiducial accurately marking location of the area of interest in the "y-direction".

Figure 12:
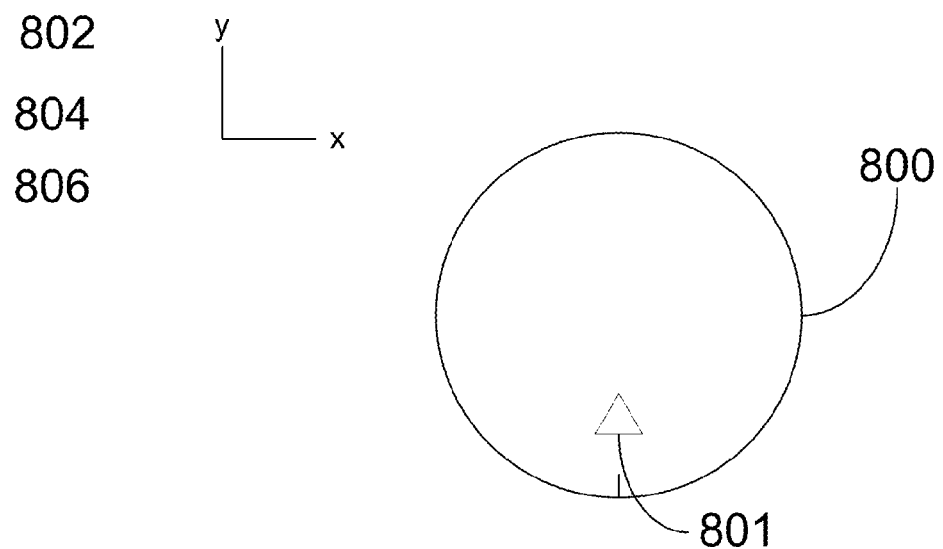
FIG. 12 shows a plan view of a sample 800 including an area of interest 801 in an imaging position.
Figure 13:
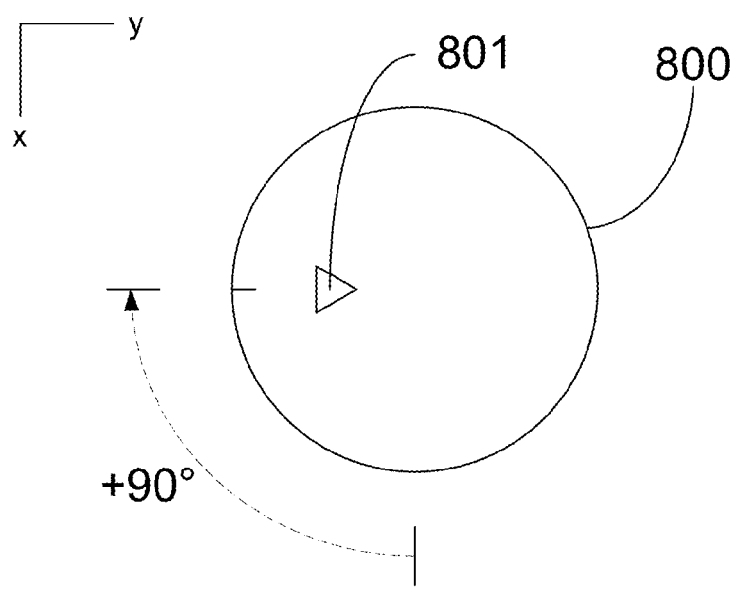
FIG. 13 shows a plan view of sample 800 rotated by an angle of ninety degrees from its imaging position to its deposition position prior to depositing a fiducial.

FIG. 12 shows a plan view of a sample 800 including an area of interest 801 in an imaging position. The imaging position is the position of the sample used when imaging the area of interest with a charged particle beam. In this example, a 3D fiducial is to be deposited over area of interest 801 using a non-orthogonal charged particle beam. Because the charged particle beam is directed at an angle that is not orthogonal to the surface of sample 800, the deposition profile of the fiducial is not orthogonal to the sample surface in the direction of the charged particle beam. To compensate, one or more embodiments of the present invention rotates sample 800 ninety degrees (+90°) from its imaging position to a deposition position before depositing the fiducial. FIG. 13 shows a plan view of sample 800 rotated by an angle of ninety degrees from its imaging position to its deposition position prior to depositing a fiducial.

Figure 14:
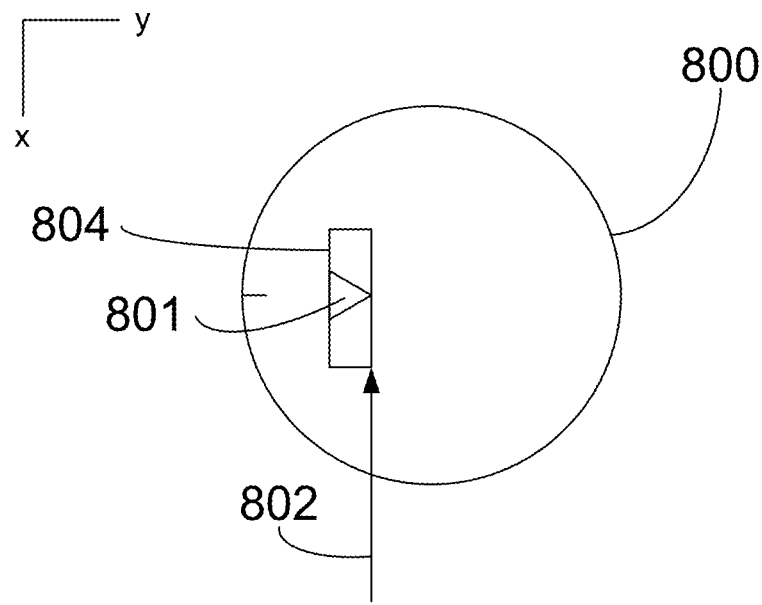
FIG. 14 shows a plan view of sample 800 in the deposition position including a deposited fiducial 804.

FIG. 14 shows a plan view of sample 800 rotated into the deposition position and including a deposited 3D fiducial 804. After rotating the sample 800 by an angle of ninety degrees from its imaging position to its deposition position, charged particle beam 802 is directed at the surface of sample 800 over area of interest to deposit fiducial 804. Charged particle beam 802 is preferably scanned in a raster pattern. That is, charged particle beam 802 is scanned in rows from left to right in the x-direction, and from top to bottom in the y-direction. Because charged particle beam 802 is not orthogonal to the sample surface in 800 in the x-direction, the deposition profile of the fiducial is not orthogonal to the sample surface in the x-direction. Because charged particle beam 802 is orthogonal to the sample surface in 800 in the y-direction, the deposition profile of the fiducial is orthogonal to the sample surface in the y-direction. By rotating the sample 800 from the imaging position to the deposition position prior to depositing the fiducial, the fiducial can be accurately placed with respect to the y-direction because the deposition profile of the fiducial is orthogonal to the sample surface in the y-direction. This is demonstrated in greater detail with the side views of FIGS. 8-9.

Figure 15:
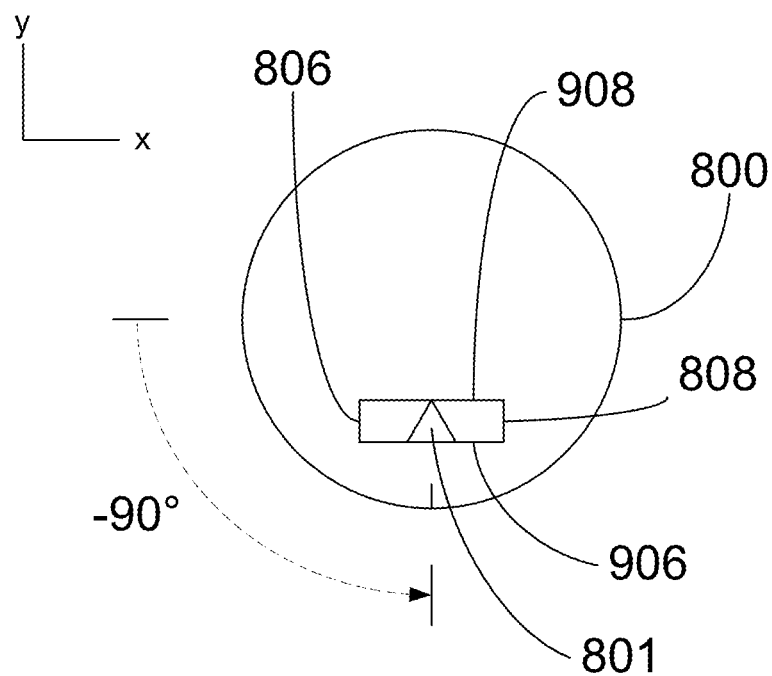
FIG. 15 shows a plan view of sample 800, including deposited fiducial 804, rotated back into the imaging position.

FIG. 15 shows a plan view of sample 800, including deposited 3D fiducial 804, rotated back into the imaging position. After depositing fiducial 804, sample 800 is rotated ninety (−90°) degrees back to its imaging position. Sides 806 and 808 of fiducial 804 are not orthogonal to the surface of sample 800 and are not well-suited for accurate placement relative to area of interest 801. Sides 906 and 908 are orthogonal to the surface of sample 800 and are well-suited for accurate placement relative to area of interest 801.

Figure 8:
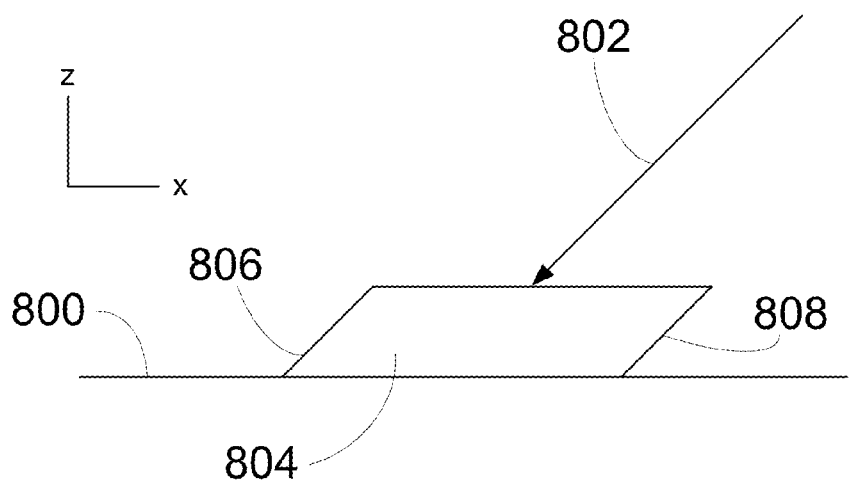
FIG. 8 shows a side view in the "x-direction" of a 3D fiducial formed by sweeping a charged particle beam in the direction of the x-axis.

FIG. 8 shows a side view of the "x-direction" profile of 3D fiducial 804 in the deposition position. Charged particle beam 802 is scanned in a raster pattern, preferably in the presence of a deposition precursor gas, to deposit a block of material for 3D fiducial 804 on sample 200. Charged particle beam 802 first forms side 806 and finishes with side 808. Because charged particle beam 802 is directed at an angle that is not orthogonal to the surface of sample 200 in the x-direction, sides 806 and 808 of 3D fiducial 804 are also not orthogonal to the surface of sample 200 in the x-direction. Sides 806 and 808 of 3D fiducial 804, because they are not orthogonal to the surface of sample 200 in the x-direction, are not suitable for marking a location of an area of interest in the x-direction. That is, sides 806 and 808 are "leaning" in the x-direction so that the top of 3D fiducial 804 has a different location in the x-direction than the bottom of 3D fiducial 804.

Figure 9:
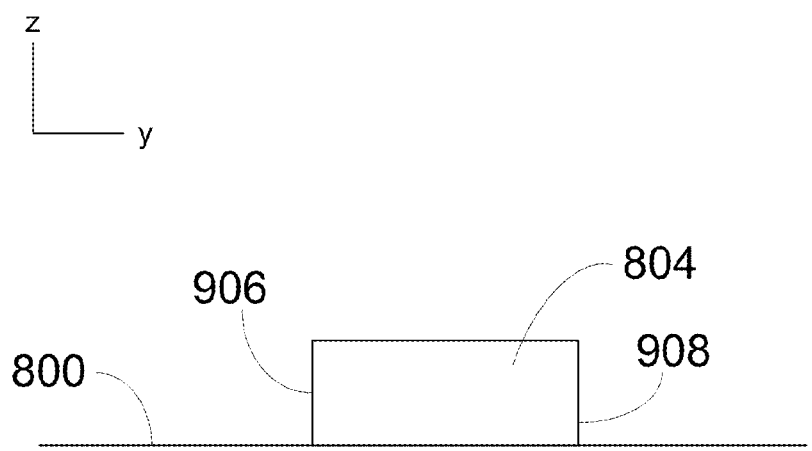
FIG. 9 shows a side view in the "y direction" of a 3D fiducial formed by sweeping a charged particle beam in the direction of the x-axis of FIG. 8.

FIG. 9 shows a side view of the "y-direction" profile of 3D fiducial 804 in the deposition position. Charged particle beam (not shown) is scanned in a raster pattern, preferably in the presence of a deposition precursor gas, to deposit a block of material for 3D fiducial 804 on sample 200. Charged particle beam 802 is scanned from side 906 toward side 908, then is turned to side 906 and move slightly out of the plane of FIG. 9 to form another row. Because charged particle beam 802 is directed at an angle that is orthogonal to the surface of sample 200 in the y-direction, sides 906 and 908 of 3D fiducial 804 are also substantially orthogonal to the surface of sample 200. Sides 906 and 908 of 3D fiducial 804, because they are substantially orthogonal to the surface of sample 200, are suitable for marking a location of an area of interest. That is, sides 906 and 908 are not "leaning" in the y-direction so that the top of 3D fiducial 804 has substantially the same location in the y-direction as the bottom of 3D fiducial 804.

Figure 10:
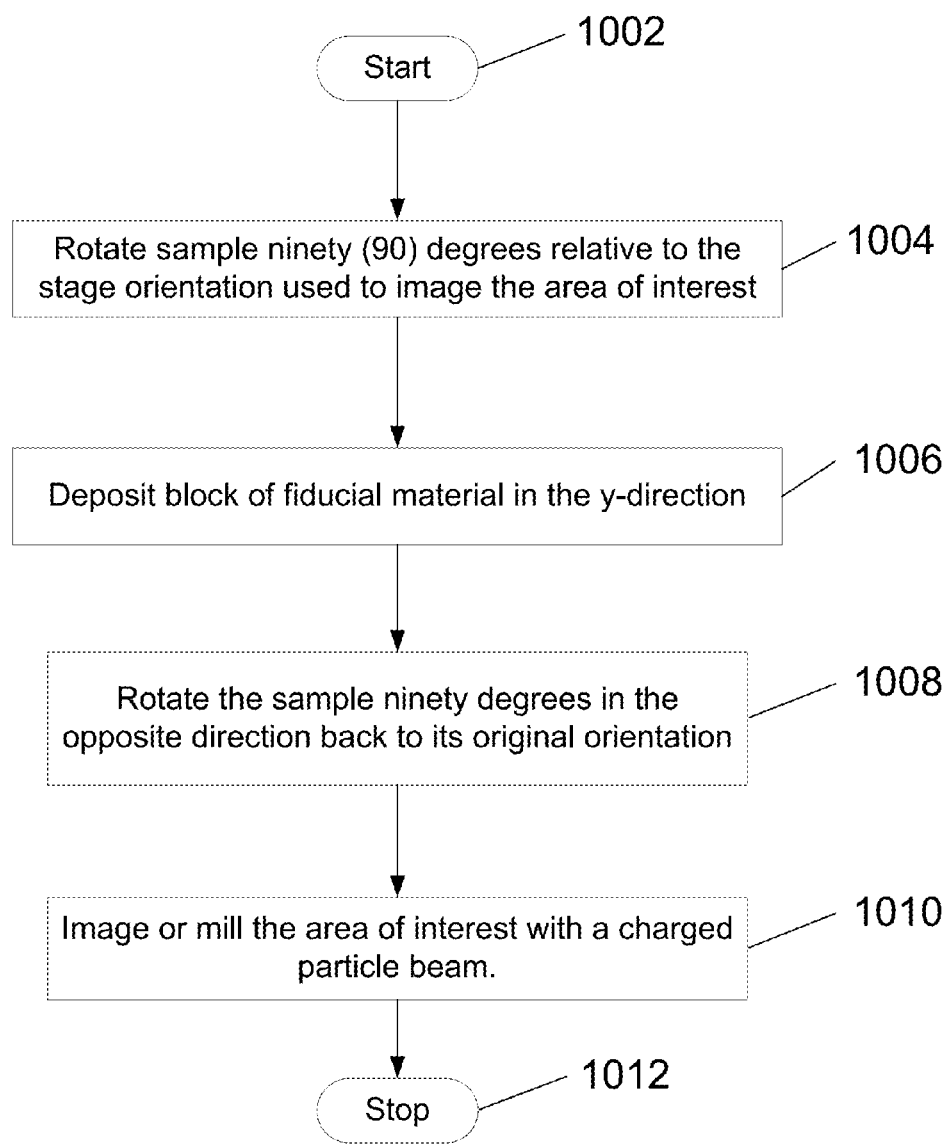
FIG. 10 shows a flowchart for a method to correct for a 3D fiducial having a non-orthogonal deposition profile.

FIG. 10 shows a flowchart for a method to correct for a 3D fiducial having a non-orthogonal deposition profile. Sample 200 is initially rotated ninety (90) degrees relative to the imaging position, the stage orientation used to image area of interest 202 (step 1004). After rotating the sample ninety degrees (+90°) into the deposition position, the deposition of the block of material is created in the y-direction (step 1006). The sample is then rotated ninety degrees in the opposite direction (−90°) back to its original orientation, the imaging position, (step 1008) and imaged with the FIB or SEM (step 1010). The deposition center is the center of the 3D fiducial and not a function of deposition time or thickness. The x-direction 3D fiducial now has a z-direction orthogonal profile.

Figure 11:
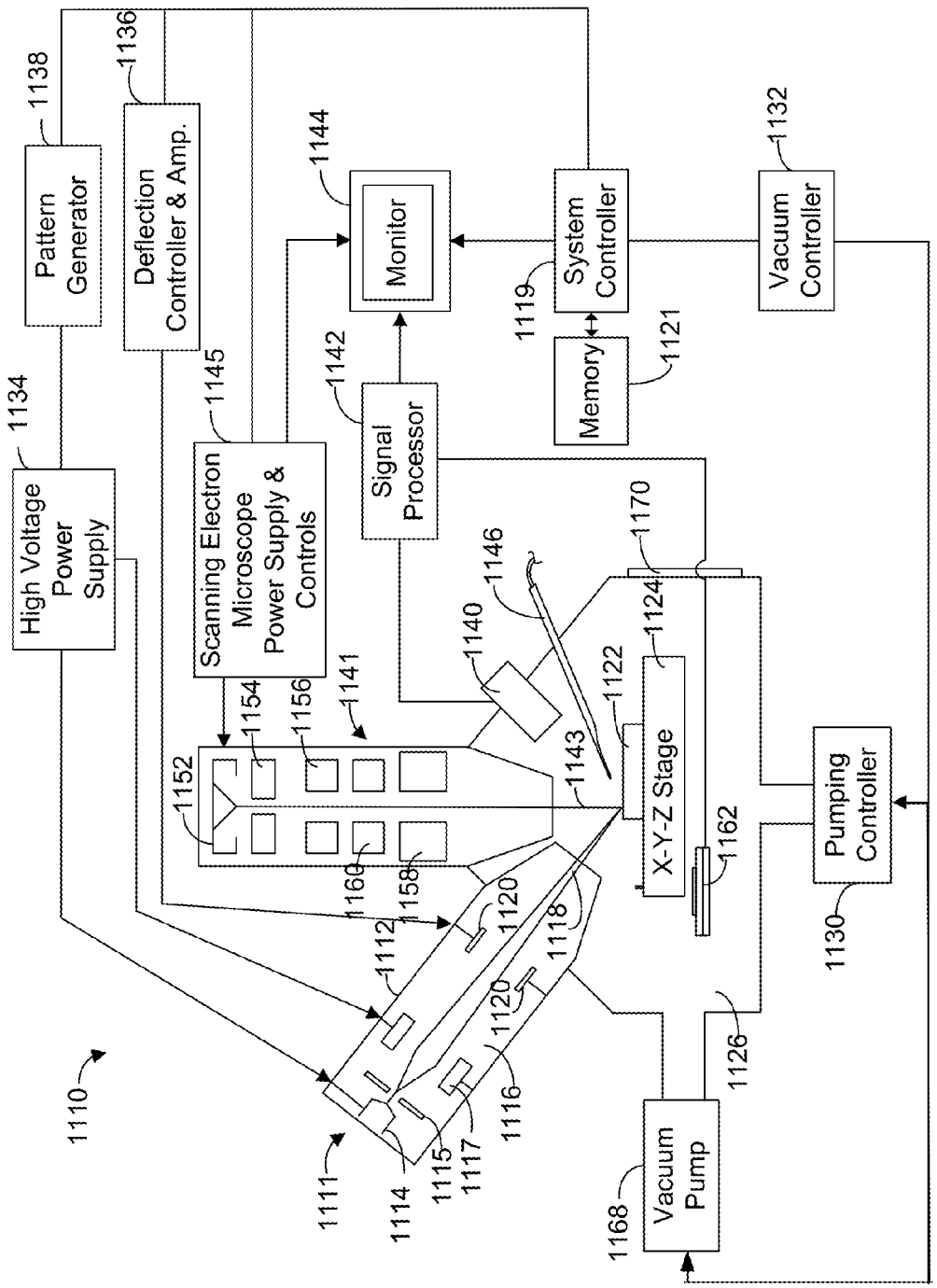
FIG. 11 shows an exemplary dual beam FIB/SEM system 1110 that could be used to implement preferred embodiments of the present invention.

FIG. 11 shows an exemplary dual beam FIB/SEM system 1110 that could be used to implement preferred embodiments of the present invention. While reference is made to a dual beam system, aspects of the present invention are not limited to a dual beam system, but may also be implemented in other charged particle beam systems, such as single beam systems. One embodiment of the present invention utilizes a dual beam FIB/SEM system 1110 that uses an ion beam that is either normal or tilted by a few degrees to the plane of the sample surface and an electron beam having an axis that is also tilted, e.g., fifty-two (52) degrees from the axis of ion beam. In some embodiments, the ion beam and electron beam are capable of aligning so that the fields of view of both beams are coincident to within a few microns or less. The ion beam is typically used to image and machine the work piece, and the electron beam is used primarily for imaging but can also be used for some modification of the work piece. The electron beam will typically produce an image of a higher resolution than the ion beam image, and it will not damage the viewed surface like the ion beam. The image formed by the two beams can look different, and the two beams can therefore provide more information than a single beam.

Such a dual beam system could be made from discrete components or alternatively, could be derived from a conventional device such as an Altura™ or an Expida™ system available from FEI Company of Hillsboro, Oreg. The present invention could also be implemented using other particle beam systems, including for example, single beam systems, such as FIB or SEM only systems, or dual beam systems having two FIB columns.

Focused ion beam system 1110 includes an evacuated envelope 1111 having an upper neck portion 1112 within which are located an ion source 1114 and a focusing column 1116 including extractor electrodes and an electrostatic optical system. Ion beam 1118 passes from ion source 1114 through column 1116 and between electrostatic deflection means schematically indicated at 1120 toward sample 1122, which comprises, for example, a semiconductor device positioned on movable X-Y-Z stage 1124 within lower chamber 1126. An ion pump or other pumping system (not shown) can be employed to evacuate neck portion 1112. The chamber 1126 is evacuated with turbomolecular and mechanical pumping system 1130 under the control of vacuum controller 1132. The vacuum system provides within chamber 1126 a vacuum of between approximately 1×10−7 Torr and 5×10−4 Torr. If an etch assisting, an etch retarding gas, or a deposition precursor gas is used, the chamber background pressure may rise, typically to about 1×10−5 Torr.

High voltage power supply 1134 is connected to ion source 1114 as well as to appropriate electrodes in focusing column 1116 for forming an ion beam 1118 and directing the same downwardly. Deflection controller and amplifier 1136, operated in accordance with a prescribed pattern provided by pattern generator 1138, is coupled to deflection plates 1120 whereby beam 1118 may be controlled to trace out a corresponding pattern on the upper surface of sample 1122. In some systems the deflection plates are placed before the final lens, as is well known in the art.

The ion source 1114 typically provides a metal ion beam of gallium, although other ion sources, such as a multicusp or other plasma ion source, can be used. The ion source 1114 typically is capable of being focused into a sub one-tenth micron wide beam at sample 1122 for either modifying the sample 1122 by ion milling, enhanced etch, material deposition, or for the purpose of imaging the sample 1122. A charged particle multiplier 1140 used for detecting secondary ion or electron emission for imaging is connected to signal processor 1142, where the signal from charged particle multiplier 1140 are amplified, converted into digital signals, and subjected to signal processing. The resulting digital signal is to display an image of sample 1122 on the monitor 1144.

A scanning electron microscope 1141, along with power supply and control unit 1145, is also provided with the FIB/SEM system 1110. An electron beam 1143 is emitted from a cathode 1152 by applying voltage between cathode 1152 and an anode 1154. Electron beam 1143 is focused to a fine spot by means of a condensing lens 1156 and an objective lens 1158. Electron beam 1143 is scanned two-dimensionally on the specimen by means of a deflection coil 1160. Operation of condensing lens 1156, objective lens 1158, and deflection coil 1160 is controlled by power supply and control unit 1145.

Electron beam 1143 can be focused onto sample 1122, which is on movable X-Y-Z stage 1124 within lower chamber 1126. Scanning electron microscope 1141 produces a finely focused electron beam 1143, which is scanned across the surface of the structure, preferably in a raster pattern. When the electrons in the electron beam 1143 strike the surface of work piece 1122, secondary electrons and backscattered electrons are emitted. Respectively, these electrons are detected by secondary electron detector 1140 or backscattered electron detector 1162. The analog signal produced either by secondary electron detector 1140 or backscattered electron detector 1162 is amplified and converted into a digital brightness value by signal processor unit 1142. The resulting digital signal can be displayed as an image of sample 1122 on the monitor 1144.

A door 1170 is opened for inserting sample 1122 onto stage 1124, which may be heated or cooled, and also for servicing an internal gas supply reservoir, if one is used. The door is interlocked so that it cannot be opened if the system is under vacuum. The high voltage power supply provides an appropriate acceleration voltage to electrodes in ion beam column 1116 for energizing and focusing ion beam 1118.

A gas delivery system 1146 extends into lower chamber 1126 for introducing and directing a gaseous vapor toward sample 1122. U.S. Pat. No. 5,851,413 to Casella et al. for "Gas Delivery Systems for Particle Beam Processing," assigned to the assignee of the present invention, describes a suitable gas delivery system 1146. Another gas delivery system is described in U.S. Pat. No. 5,435,850 to Rasmussen for a "Gas Injection System," also assigned to the assignee of the present invention. For example, iodine can be delivered to enhance etching, or a metal organic compound can be delivered to deposit a metal.

System controller 1119 controls the operations of the various parts of dual beam system 110. Through system controller 119, a user can cause ion beam 1118 or electron beam 143 to be scanned in a desired manner through commands entered into a conventional user interface (not shown). System controller 119 can also comprise computer-readable memory 1121 and may control dual beam system 110 in accordance with data or programmed instructions stored in memory 1121. CAD data concerning the sample/semiconductor stored in memory 1121 can be used to create a CAD polygon overlay or other positional data used to locate a feature of interest and alignment points or transfer fiducials as described above.

Figure 16:
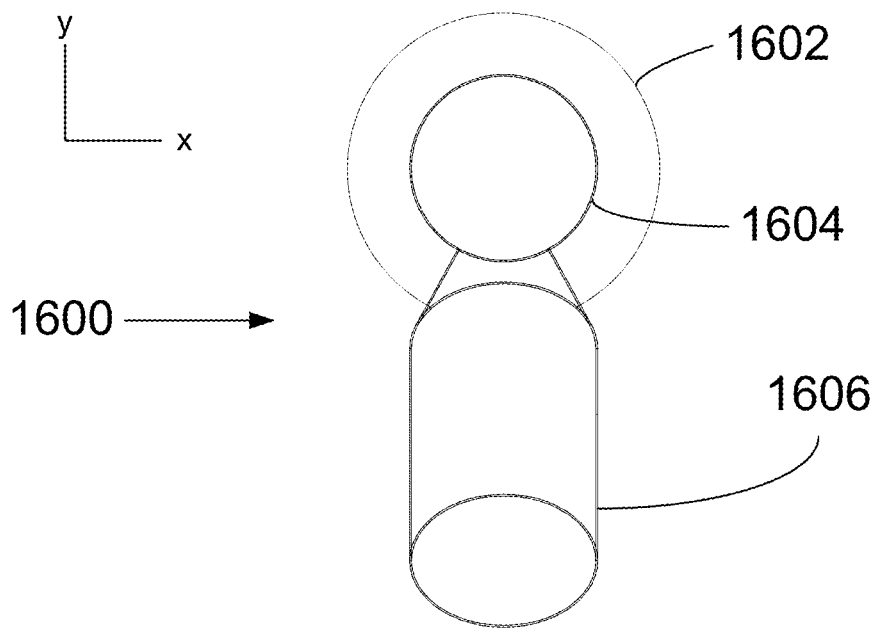
FIG. 16 shows a plan view of a dual beam system 1600 in which the SEM column 1606 is not orthogonal to the surface of the sample 1602, and the FIB column 1604 is orthogonal to the surface of the sample 1602.
Figure 17:
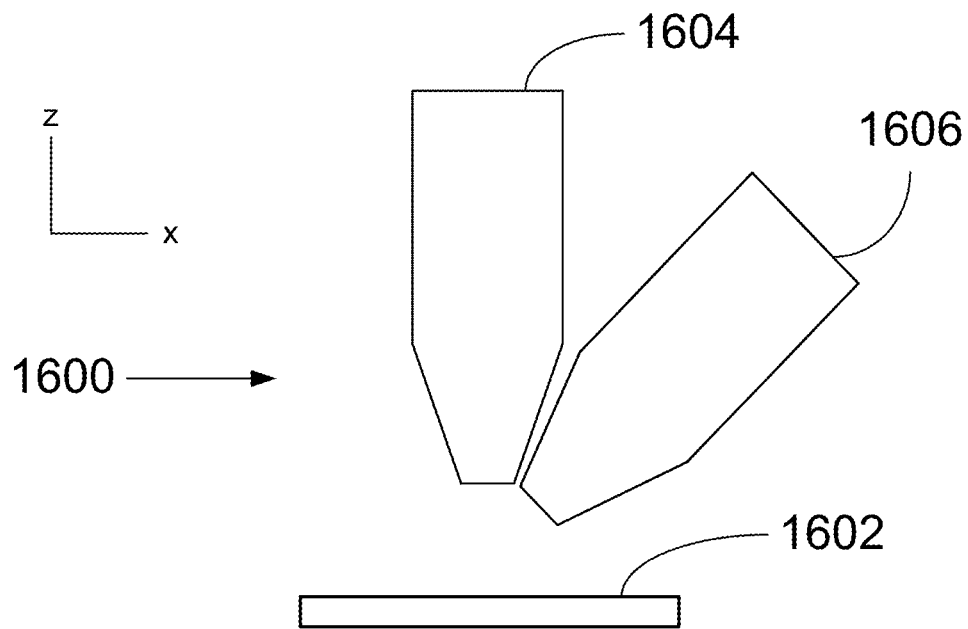
FIG. 17 shows a side view of the dual beam system 1600 in which the SEM column 1606 is not orthogonal to the surface of the sample 1602 and the FIB column 1604 is orthogonal to the surface of the sample 1602.

In alternative embodiments the FIB column is aligned so that the ion beam is directed orthogonally to the sample surface and the SEM column is aligned so that the electron beam is directed at an angle that is not orthogonal to the sample surface. For example, in accordance with embodiments of the present invention described in FIGS. 8-10 and 12-15, the SEM may preferably be aligned so that the electron beam is directed at a forty-five degree(45°) angle to the surface of the sample. FIGS. 16-17 show illustrations of alternative embodiments the FIB column is aligned so that the ion beam is directed orthogonally to the sample surface and the SEM column is aligned so that the electron beam is directed at an angle that is not orthogonal to the sample surface. FIG. 16 shows a plan view of a dual beam system 1600 in which the SEM column 1606 is not orthogonal to the surface of the sample 1602, and the FIB column 1604 is orthogonal to the surface of the sample 1602. FIG. 17 shows a side view of the dual beam system 1600 in which the SEM column 1606 is not orthogonal to the surface of the sample 1602 and the FIB column 1604 is orthogonal to the surface of the sample 1602.

Although the present invention and its advantages have been described in detail, it should be understood that various changes, substitutions and alterations can be made herein without departing from the spirit and scope of the invention as defined by the appended claims. Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

We claim as follows:

1. A method of forming and using a fiducial on a sample to locate an area of interest on the sample, the method comprising:
    forming a fiducial by:
        depositing a block of material on a sample proximal to an area of interest on the sample, the block of material extending from the surface of the sample to a detectable extent above the surface of the sample; and
        milling, using a charged particle beam, a predetermined pattern into at least two exposed faces of the block of material;
    subsequent to forming the fiducial, detecting the location of the area of interest by detecting the location of the fiducial; and
    subsequent to detecting the location of the area of interest, imaging or milling the area of interest with a charged particle beam.

2. The method of claim 1, in which detecting the location of the fiducial includes:
    imaging at least a portion of the surface of the sample using a charged particle beam; and
    detecting the predetermined pattern of the fiducial in the image of the portion of the sample.

3. The method of claim 2, in which the predetermined pattern of the fiducial in the image of the portion of the sample is automatically detected by image recognition software.

4. The method of claim 1, in which the predetermined pattern is milled into the fiducial so that the fiducial will have a brightness or contrast value that is distinct from the block of material when the fiducial is imaged by a charged particle beam.

5. The method of claim 1, in which the deposited block of material is capable of being imaged or milled by a charged particle beam in at least two dimensions.

6. The method of claim 1, in which the fiducial is positioned at a location where the fiducial can be simultaneously imaged by at least two charged particle beams.

7. The method of claim 1, in which imaging is performed by an electron beam and milling is performed by a focused ion beam.

8. The method of claim 1, in which the deposited block of material has a substantially parallelepiped geometry.

9. A fiducial for locating an area of interest on a sample, the fiducial comprising:
    a block of material deposited proximal to an area of interest on a sample; the block of material extending from the surface of the sample to a detectable extent above the surface of the sample; and
    a predetermined pattern milled into at least two exposed faces of the block of material.

10. The fiducial of claim 9, in which the largest dimension of the fiducial is no greater than one hundred micrometers (100 µm).

11. The fiducial of claim 9, in which the largest dimension of the fiducial is no greater than ten micrometers (10 µm).

12. The fiducial of claim 9, in which the largest dimension of the fiducial is no greater than one micrometer (1 µm).

13. The fiducial of claim 9, in which the block of material comprises a raised Platinum pad.

14. The fiducial of claim 9, in which the predetermined pattern is milled into the fiducial so that the fiducial will have a brightness or contrast value that is distinct from the block of material when the fiducial is imaged by a charged particle beam.

15. The fiducial of claim 9, in which the fiducial is positioned at a location where the fiducial can be simultaneously imaged by at least two charged particle beams.

16. The fiducial of claim 9, in which the deposited block of material has a substantially parallelepiped geometry.

17. A system comprising:
    at least one charged particle beam;
    a sample stage;
    a sample disposed upon the sample stage;
    a fiducial disposed upon the sample, the fiducial comprising:
        a block of material deposited proximal to an area of interest on the sample; the block of material extending from the surface of the sample to a detectable extent above the surface of the sample; and
        a predetermined pattern milled into at least two exposed faces of the block of material.

18. The system of claim 17, in which the largest dimension of the fiducial is no greater than one hundred micrometers (100 µm).

19. The system of claim 17, in which the largest dimension of the fiducial is no greater than ten micrometers (10 µm).

20. The system of claim 17, in which the largest dimension of the fiducial is no greater than one micrometer (1 µm).

21. The system of claim 17, in which the block of material comprises a raised Platinum pad.

22. The system of claim 17, in which the predetermined pattern is milled into the fiducial so that the fiducial will have a brightness or contrast value that is distinct from the block of material when the fiducial is imaged by a charged particle beam.

23. The system of claim 17, in which the fiducial is positioned at a location where the fiducial can be simultaneously imaged by at least two charged particle beams.

24. The system of claim 17, in which the deposited block of material has a substantially parallelepiped geometry.

25. A method of forming a fiducial on a sample to locate an area of interest on the sample, the method comprising:
    rotating the sample substantially ninety (90) degrees from an imaging position;
    subsequent to rotating the sample substantially ninety (90) degrees from the imaging position, depositing a block of material on or near the area of interest using a charged particle beam that is directed toward the surface of the sample at an angle that is not perpendicular to the surface of the sample; and
    subsequent to depositing the block of material and prior to detecting the location of the area of interest, rotating the sample substantially ninety (90) degrees to return the sample back to its initial position.

26. The method of claim 25, in which the charged particle beam is an electron beam of a scanning electron microscope, the electron beam being directed at the sample surface at an angle that is not orthogonal to the sample surface.

27. The method of claim 26, further comprising:
subsequent to forming the fiducial, locating the area of interest by locating the fiducial and directing a focused ion beam toward the area of interest, the focused ion beam being directed at the sample surface at an angle that is substantially orthogonal to the sample surface.

\* \* \* \* \*